(12) United States Patent
Lee et al.

(10) Patent No.: US 8,081,038 B2
(45) Date of Patent: Dec. 20, 2011

(54) RING OSCILLATOR HAVING WIDE FREQUENCY RANGE

(75) Inventors: Hui Dong Lee, Daejeon (KR); Kwi Dong Kim, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 119 days.

(21) Appl. No.: 12/507,687

(22) Filed: Jul. 22, 2009

(65) Prior Publication Data

US 2010/0156544 A1 Jun. 24, 2010

(30) Foreign Application Priority Data

Dec. 22, 2008 (KR) .................. 10-2008-0131512
Mar. 27, 2009 (KR) .................. 10-2009-0026593

(51) Int. Cl.
*H03K 3/03* (2006.01)

(52) U.S. Cl. .................. 331/57; 331/179; 331/177 V

(58) Field of Classification Search .................. 331/57, 331/177 V, 177 R, 179, 34, 36 C
See application file for complete search history.

(56) References Cited

U.S. PATENT DOCUMENTS

| 6,094,103 | A  | * | 7/2000 | Jeong et al. ............. 331/57 |
| 6,304,149 | B1 | * | 10/2001 | Kim ........................ 331/57 |
| 2007/0008043 | A1 | | 1/2007 | Milicevic et al. |
| 2008/0211590 | A1 | | 9/2008 | Wu |
| 2008/0231378 | A1 | * | 9/2008 | Cong ....................... 331/57 |

FOREIGN PATENT DOCUMENTS

| KR | 1020020049077 A | 6/2002 |
| KR | 1020060034749 A | 4/2006 |

* cited by examiner

*Primary Examiner* — Ryan Johnson

(57) ABSTRACT

Provided is a ring oscillator having an extended range of oscillation frequency by varactors coupled to delay cells even in a simple structure. The wide frequency range results from simply varying an oscillation frequency by control signals applied to the varactors. Since additional switches connected to the delay cells contribute to increase or decrease of the oscillation frequency range, the ring oscillator can conveniently be employed in various types of oscillation systems.

9 Claims, 6 Drawing Sheets

RING OSCILLATOR HAVING WIDE FREQUENCY RANGE

CROSS-REFERENCE TO RELATED APPLICATION

This application claims priority to and the benefit of Korean Patent Application Nos. 10-2008-0131512, filed Dec. 22, 2008 and 10-2009-0026593, filed Mar. 27, 2009, the disclosures of which are incorporated herein by reference in their entirety.

BACKGROUND

1. Field of the Invention

The present invention relates to a ring oscillator operating in a wide output frequency, and more particularly, to a ring oscillator having a wide oscillation frequency range and a simple structure due to additional switches and varactors.

2. Discussion of Related Art

In general, voltage control oscillators (VCOs) are used to adjust oscillation frequencies by voltage control, which are necessary in up-conversion or down-conversion of predetermined frequencies.

The VCOs may be generally classified into ring oscillators, LC oscillators, and crystal oscillators. Among the VCOs, the ring oscillators are widely employed in clock/data recovery circuits and frequency synthesizers because of their simple structures.

FIGS. 1A and 1B illustrate conventional ring oscillators 100 and 100'.

Referring to FIG. 1A, the ring oscillator 100 has a structure in which a plurality of delay cells 100a to 100c form a loop to generate an oscillation frequency. The delay cells 100a to 100c are composed of a series of inverters for inverting and delaying an input signal.

The oscillation frequency of the ring oscillator 100 with such a configuration is variable by delay times of the delay cells 100a to 100c, as follows.

Assuming that N delay cells are arranged in the ring oscillator and the delay time of each delay cell is $t_D$, the total delay time ($2 \times N \times t_D$) counted up by the loop is an oscillation period T.

Therefore, the oscillation frequency $f_{OSC}$ can be given by Equation 1.

$$f_{OSC} = \frac{1}{2 \cdot N \cdot t_D} \quad <\text{Equation 1}>$$

As can be seen from Equation 1, the shorter the delay time $t_D$ of the delay cell used in the ring oscillator, the higher the oscillation frequency becomes. The longer the delay time $t_D$, the lower the oscillation frequency becomes.

In controlling a delay time of the delay cell, there has been a method of varying transconductance by adjusting a bias current supplied into the delay cell.

However, such a bias-current control method has a disadvantage that phase noise of the delay cell abruptly increases when the delay cell is supplied with a small bias current.

Thus, as shown in FIG. 1B, for the purpose of extending an oscillation frequency range, a ring oscillator for high speed employs a plurality of switched capacitors 110 coupled to an output node of the delay cell.

However, the ring oscillator 100' shown in FIG. 1B is disadvantageous in circuit complexity and chip area due to the arrangement of the switched capacitors 110.

Additionally, the plurality of the switched capacitors 110 may cause a large amplitude fluctuation on the oscillation frequency and thus enlarge a fluctuation of phase noise.

SUMMARY OF THE INVENTION

The present invention is directed to providing a ring oscillator operable in a wide range of oscillation frequency in a simple structure.

One aspect of the present invention provides a ring oscillator including: a plurality of delay cells coupled in a loop to generate an oscillation frequency. Each delay cell includes: a transconductance circuit receiving first differential input signals from the preceding delay cell, inverting the first differential input signals, and outputting signals, which are delayed by a predetermined time through the inversion, to first and second output nodes; an inversion-rate control circuit connected to the transconductance circuit and varying an inversion rate of the first differential input signals in response to a first control signal provided from an exterior; an active load circuit receiving second differential input signals from the delay cell preceding by two stages and providing an active load to the transconductance circuit; and an output-rate control circuit varying an output rate of differential output signals, which are generated from the transconductance circuit, in response to a second control signal provided from the exterior.

The transconductance circuit may include first and second NMOS transistors with gates to which the first differential input signals are applied. The inversion-rate control circuit may include first and second varactors.

In this embodiment, the inversion rate of the first differential input signals may be varied by capacitance values of the first and second varactors in accordance with a level of the first control signal.

The active load circuit may include first and second PMOS transistors with gates to which the second differential input signals are applied from the delay cell preceding by two stages. The output-rate control circuit may include: third and fourth PMOS transistors cross-coupled to each other between a power source voltage and the first and second output nodes; and first and second switches turning the third and fourth PMOS transistors on/off in response to the second control signal.

In this embodiment, when the third and fourth PMOS transistors are turned on by the first and second switches in response to the second control signal, the third and fourth PMOS transistors latch the differential output signals to increase the output rate of the differential output signals.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention.

Figure 2:
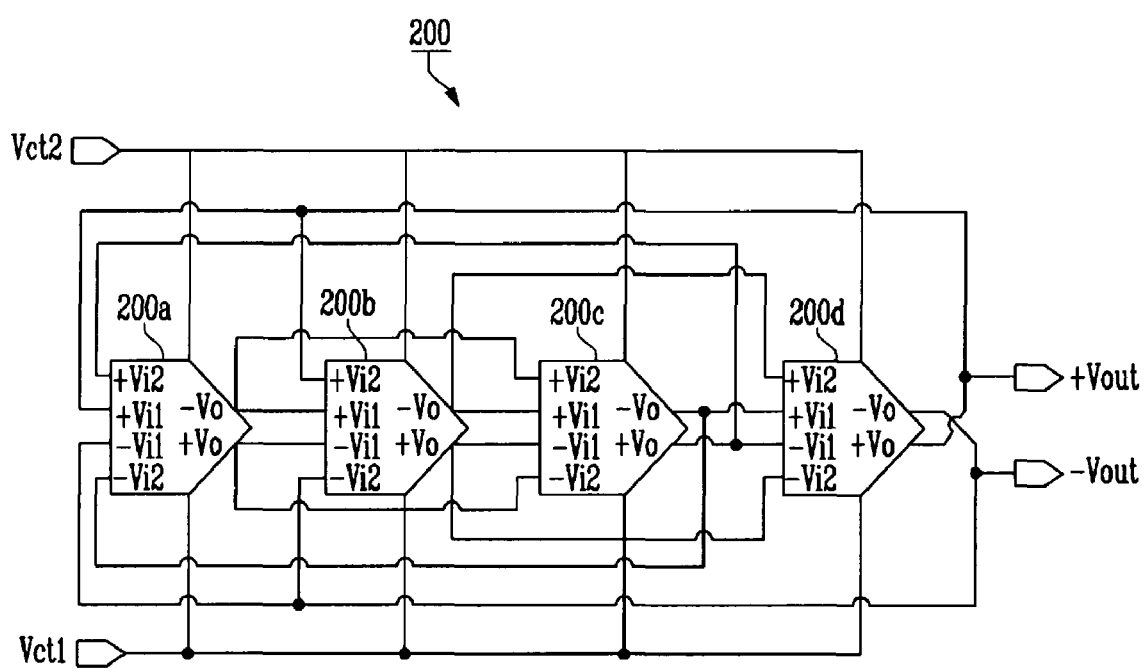
FIG. 2 illustrates a ring oscillator according to an exemplary embodiment of the present invention.

FIG. 2 illustrates a ring oscillator 200 according to an exemplary embodiment of the present invention.

Referring to FIG. 2, the ring oscillator 200 has a structure in which first through fourth delay cells 200a to 200d inverting and delaying an input signal are coupled in a loop to generate an oscillation frequency. The delay cells 200a to 200d may be composed of inverters or delay circuits inverting and delaying an input signal.

Each of the delay cells 200a to 200d inverts first differential input signals +Vi1 and −Vi1 provided from the former delay cell, and generates differential output signals −Vo and +Vo which are delayed by a predetermined time through the inversion.

During this, a first control signal Vct1 functions to control an inversion rate of the first differential input signals +Vi1 and −Vi1. A second control signal Vct2 makes the delay cells 200a to 200d operate in a differential or single mode so as to control an output rate of the differential output signals −Vo and +Vo.

Now an operation of the first delay cell 200a as a representative will be described.

First, the differential output signals −Vo and +Vo of the fourth delay cell 200d are applied to the first delay cell 200a as the first differential input signals −Vi1 and +Vi1. At the same time, the differential output signals −Vo and +Vo of the third delay cell 200c, preceding by two stages, are applied to the first delay cell 200a as second differential input signals −Vi2 and +Vi2.

Then, the first delay cell 200a inverts and delays the first differential input signals +Vi1 and −Vi1 by a predetermined time in response to the first control signal Vct1, and generates the differential output signals −Vo and +Vo.

During this, the second control signal Vct2 controls an output rate of the differential output signals −Vo and +Vo.

The second, third, and fourth delay cells 200b to 200d are the same as the first delay cell 200a in operation.

In the meantime, the delay cells 200a to 200d are configured in the following interconnection structure for the Barkhausen oscillation condition.

The negative and positive differential output signals −Vo and +Vo of the first, second, and third delay cells 200a to 200c are each applied to their next delay cells as the first differential input signals +Vi1 and −Vi1 respectively.

In order to conform the ring oscillator 200 to the Barkhausen oscillation condition where a loop gain is over 1 in a small-signal equivalent circuit model and a phase of the loop gain is an integer times 360°, the negative and positive differential output signals −Vo and +Vo of the fourth delay cell 200d are fed back and cross-coupled to the first negative and positive differential input signals −Vi1 and +Vi1 of the first delay cell 200a.

The negative and positive differential output signals −Vo and +Vo of the first delay cell 200a are respectively applied as the second positive and negative differential input signals +Vi2 and −Vi2 of the third delay cell 200c. The negative and positive differential output signals −Vo and +Vo of the second delay cell 200b are respectively applied as the second positive and negative differential input signals +Vi2 and −Vi2 of the fourth delay cell 200d.

As mentioned above, for the Barkhausen oscillation condition, the negative and positive differential output signals −Vo and +Vo of the third delay cell 200c are fed back and cross-coupled to the second negative and positive differential input signals −Vi2 and +Vi2 of the first delay cell 200a. And, the negative and positive differential output signals −Vo and +Vo of the fourth delay cell 200d are also fed back and cross-coupled to the second negative and positive differential input signals −Vi2 and +Vi2 of the second delay cell 200b.

The fed-back differential output signals, among the differential output signals generated from the delay cells 200a to 200d, are cross-coupled to other delay cells to be input.

While this embodiment exemplifies the ring oscillator including even delay cells, it may also be preferable to design the interconnection arrangement of differential input and output signals to be cross-coupled with each other when the ring oscillator has odd delay cells.

The structural and operational features of the delay cell will be further described.

Figure 3:
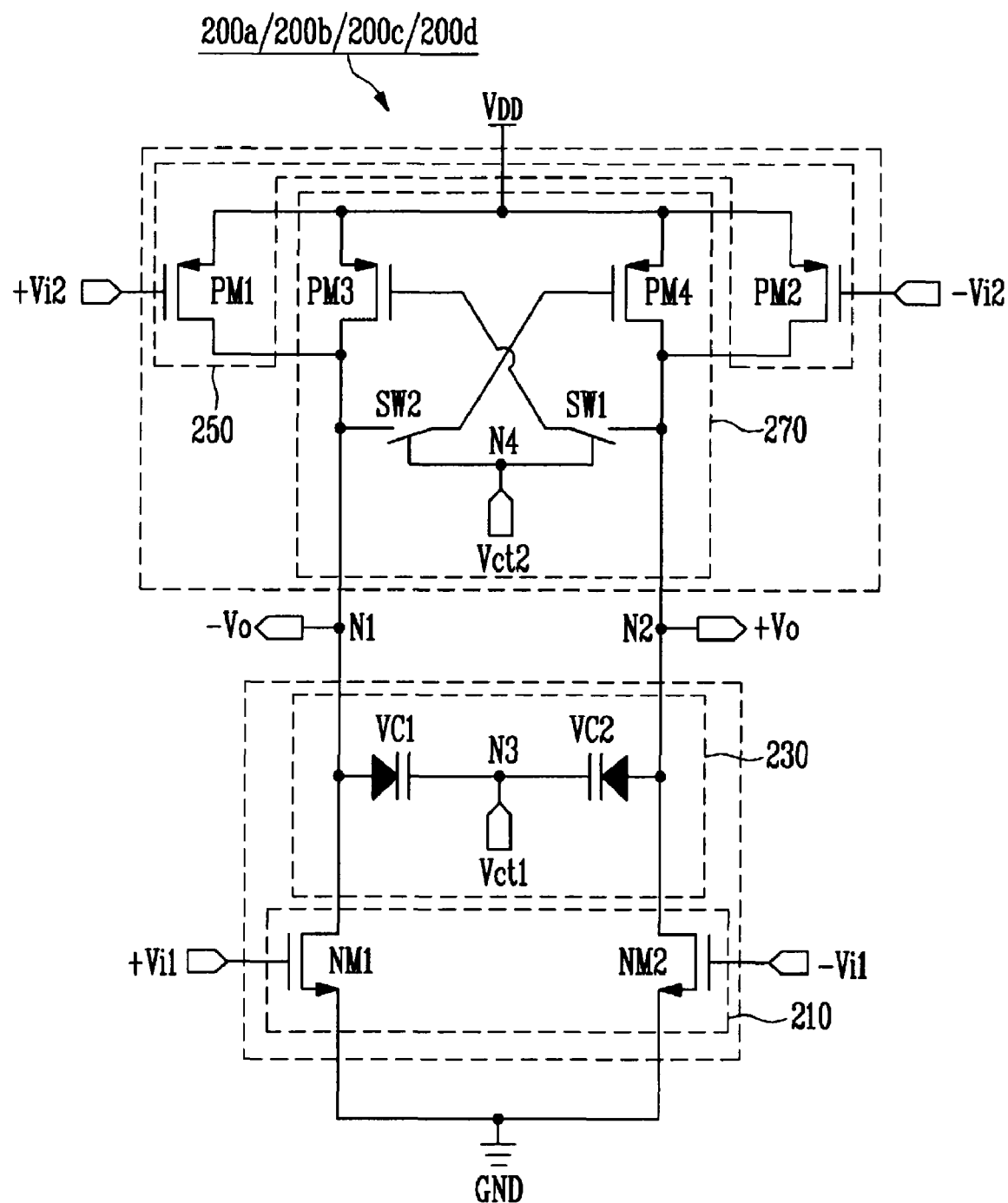
FIG. 3 illustrates a circuit of one of the delay cells shown in FIG. 2.

FIG. 3 illustrates a circuit of one of the delay cells 200a to 200d, shown in FIG. 2.

Referring to FIG. 3, each of the delay cells 200a to 200d constituting the ring oscillator 200 includes a transconductance circuit 210, an inversion-rate control circuit 230, an active load circuit 250, and an output-rate control circuit 270. The transconductance circuit 210 logically inverts the first differential input signals +Vi1 and −Vi1 and generates the differential output signals −Vo and +Vo which are delayed by a predetermined time through the inversion. The inversion-rate control circuit 230 is connected to the transconductance circuit 210 and varies an inversion rate (i.e., inversion delay time) of the first differential input signals −Vi1 and +Vi1 in response to the first control signal Vct1. The active load circuit 250 provides active loads to the transconductance circuit 210 in response to the second differential input signals +Vi2 and −Vi2. The output-rate control circuit 270 varies an output rate (i.e., output delay time) of the differential output signals −Vo and +Vo in response to the second control signal Vct2.

The transconductance circuit 210 and the inversion-rate control circuit 230 may be seen as forming a transconductance module. On the other hand, the active load circuit 250 and the output-rate control circuit 270 may be seen as forming an active load module.

The transconductance circuit 210 is composed of first and second NMOS transistors NM1 and NM2 that invert the first differential input signals +Vi1 and −Vi1 by a given transconductance and generate the differential output signals −Vo and +Vo delayed by a predetermined time through the inversion. The inversion-rate control circuit 230 is composed of first and second varactors VC1 and VC2 that vary an inversion rate of the first differential input signals +Vi1 and −Vi1 in response to the first control signal Vct1.

The active load circuit 250 is composed of first and second PMOS transistors PM1 and PM2 that have a predetermined transconductance. The output-rate control circuit 270 is composed of third and fourth PMOS transistors PM3 and PM4 that are cross-coupled to each other, and first and second switches SW1 and SW2 that turn the third and fourth PMOS transistors PM3 and PM4 on/off in response to the second control signal Vct2.

For convenience of description, the state in which the third and fourth PMOS transistors PM3 and PM4 are turned off is referred to as a "single mode," and the state in which the third and fourth PMOS transistors PM3 and PM4 are turned on is referred to as a "differential mode".

In detail, the delay cell is configured as follows.

The first NMOS transistor NM1 is connected between the ground GND and a first output node N1 from which the negative differential output signal −Vo is output. The second NMOS transistor NM2 is connected between the ground GND and a second output node N2 from which the positive differential output signal +Vo is output. The first differential input signals +Vi1 and −Vi1 are applied to gates of the first and second NMOS transistors NM1 and NM2. Drains of the first and second NMOS transistors NM1 and NM2 are each connected to the first and second output nodes N1 and N2. Sources of the first and second NMOS transistors NM1 and NM2 are commonly connected to the ground GND.

The first varactor VC1 is connected between the drain of the first NMOS transistor NM1 and a third node N3. The second varactor VC2 is connected between the drain of the second NMOS transistor NM2 and the third node N3. The first control signal Vct1 is input to the third node N3.

The first and second PMOS transistors PM1 and PM2 are connected between the power source voltage VDD and the first and second output nodes N1 and N2, respectively. The differential output signals of the delay cell preceding by two stages are applied to gates of the first and second PMOS transistors PM1 and PM2 as the second differential input signals +Vi2 and −Vi2. Sources of the first and second PMOS transistors PM1 and PM2 are commonly connected to the power source voltage VDD. Drains of the first and second PMOS transistors PM1 and PM2 are each connected to the first and second output nodes N1 and N2.

By applying the differential output signals of the delay cell preceding by two stages to the gates of the first and second PMOS transistors PM1 and PM2 as the second differential input signals +Vi2 and −Vi2, the first and second PMOS transistors PM1 and PM2 operate faster than the first and second NMOS transistors NM1 and NM2. The first and second PMOS transistors PM1 and PM2 are basically later then the first and second NMOS transistors NM1 and NM2 in operation rate. Thereby, output rates of the differential output signals −Vo and +Vo become faster.

The third and fourth PMOS transistors PM3 and PM4 are cross-coupled to each other between the power source voltage VDD and the first and second output nodes N1 and N2. The first and second switches SW1 and SW2 that are turned on/off in response to the second control signal Vct2 applied thereto through a fourth node N4 are coupled to gates of the third and fourth PMOS transistors PM3 and PM4, respectively. Drains of the third and fourth PMOS transistors PM3 and PM4 are connected to the drains of the first and second PMOS transistors PM1 and PM2, respectively. Sources of the third and fourth PMOS transistors PM3 and PM4 are connected to the power source voltage VDD in common.

Each of the delay cells 200a to 200d with such a configuration has the operational features that: (1) the oscillation frequency is variable by controlling an inversion rate of the first differential input signals +Vi1 and −Vi1 through the inversion-rate control circuit 230; and (2) the oscillation frequency is further variable by controlling an output rate of the differential output signals −Vo and +Vo in the single or differential mode that is set by the output-rate control circuit 270, which will be described below.

(1) Varying the Oscillation Frequency by the Inversion-Rate Control Circuit 230

In the first and second varactors VC1 and VC2 forming the inversion-rate control circuit 230, capacitance is variable by the first control signal Vct1. Now, an effect of the first and second varactors VC1 and VC2 on the oscillation frequency will be described.

Figure 4A:
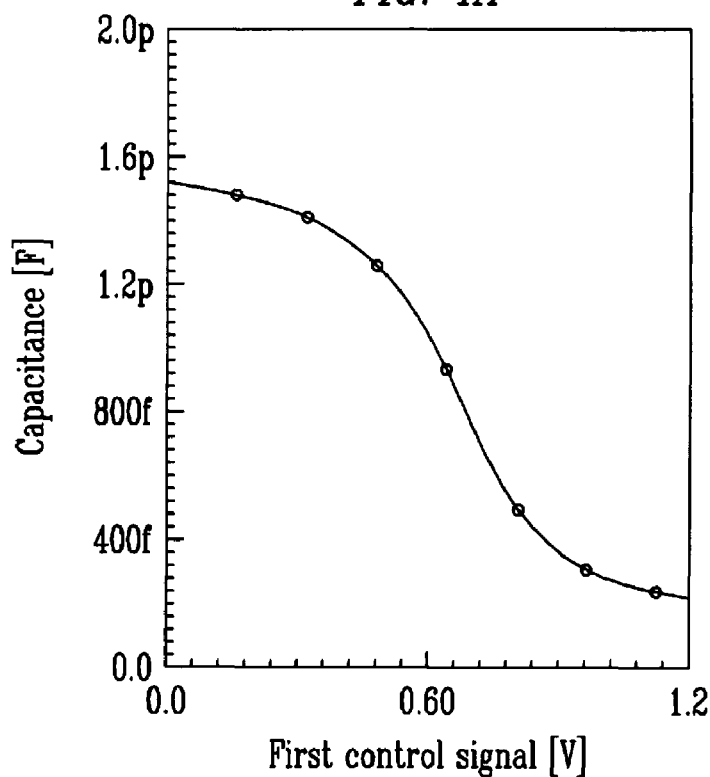
FIGS. 4A and 4B show changes in capacitance of first and second varactors, responding to a first control signal, in single and differential modes.
Figure 4B:
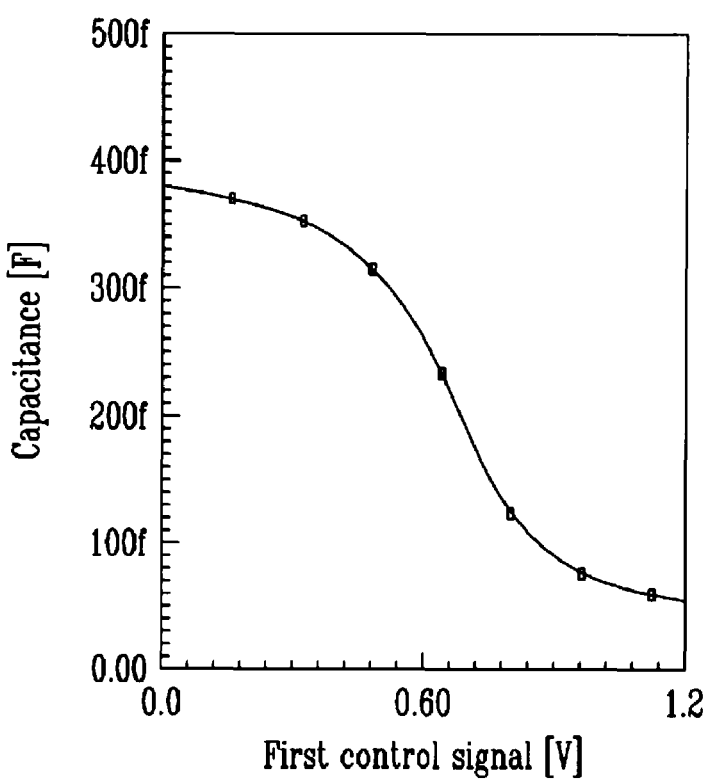

FIGS. 4A and 4B are graphs plotting changes in capacitance of the first and second varactors VC1 and VC2 shown in FIG. 3, responding to the first control signal Vct1, in the single and differential modes.

Referring to FIGS. 4A and 4B, it can be seen that the capacitance of the first and second varactors VC1 and VC2 decreases according to elevation of the first control signal Vct1 applied to the first and second varactors VC1 and VC2.

When the capacitance of the first and second varactors VC1 and VC2 decreases, the first and second NMOS transistors NM1 and NM2 decrease in capacitance without variation of their transconductance. When the capacitance of the first and second NMOS transistors NM1 and NM2 is reduced, the inversion rate of the first differential input signals +Vi1 and −Vi1 becomes higher to shorten a delay time of inversion. As a result, the oscillation frequency becomes higher.

The conventional ring oscillator 100 is disadvantageous in circuit complexity and chip area because it must include the additional switched capacitor 110 for varying a range of the oscillation frequency. However, the ring oscillator 200 according to an exemplary embodiment of the present invention is effective in reducing the circuit complexity and chip area since the oscillation frequency can be simply adjusted by the first control signal Vct1 applied to the first and second varactors VC1 and VC2.

And, it can be seen that the single mode of FIG. 4A is about four times larger than the differential mode of FIG. 4B in capacitance changes of the first and second varactors VC1 and VC2.

Figure 1A:
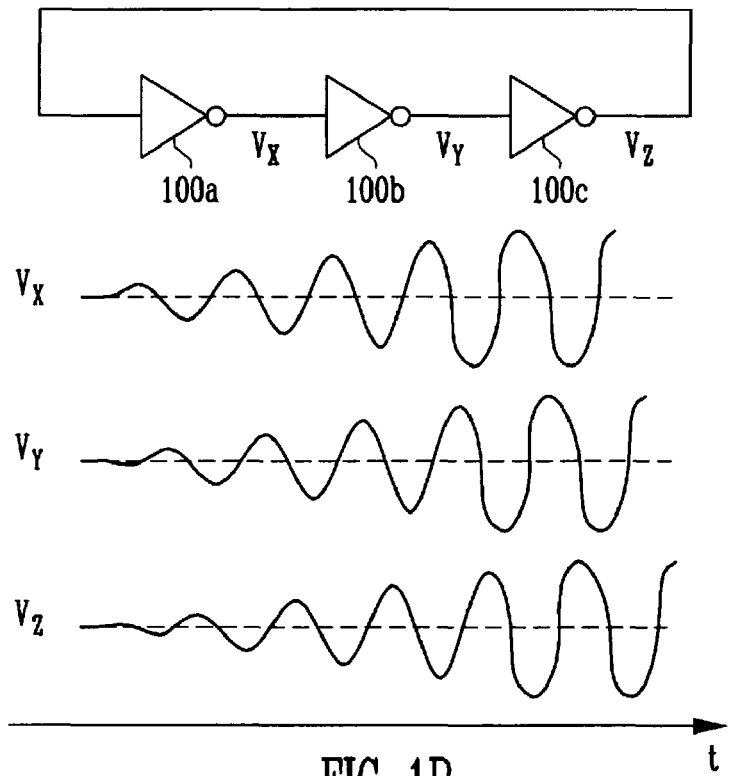
FIGS. 1A and 1B illustrate conventional ring oscillators.
Figure 1B:
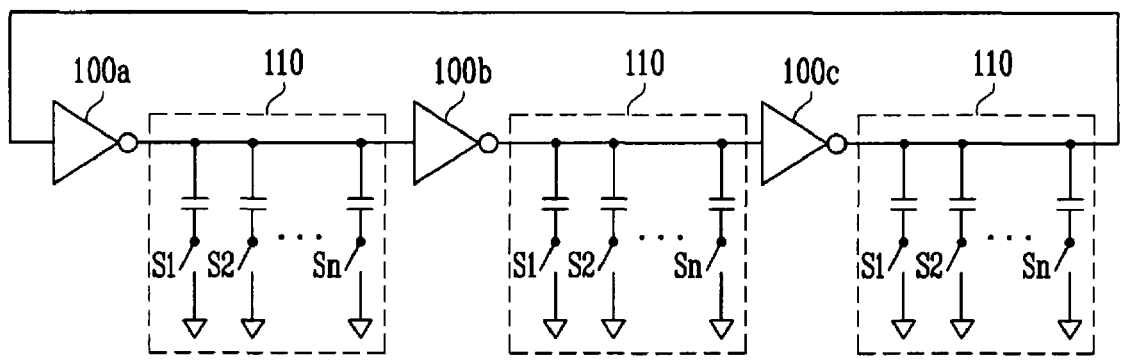

Thus, as the oscillation frequency is varied by the first control signal Vct1 applied to the first and second varactors VC1 and VC2, as well as by capacitance change of the first and second varactors VC1 and VC2 in the single or differential mode, it is permissible for the ring oscillator 200 to generate an oscillation frequency in a much wider range than the conventional art e.g., the ring oscillators 100 and 100' shown in FIGS. 1A and 1B.

(2) Varying the Oscillation Frequency by the Output-Rate Control Circuit 270

The third and fourth PMOS transistors PM3 and PM4 forming the output-rate control circuit 270 operate in the single or differential mode in response to the second control signal Vct2 to control an output rate of the differential output signals −Vo and +Vo. An effect of the third and fourth PMOS transistors PM3 and PM4 on the oscillation frequency is as follows.

Figure 5A:
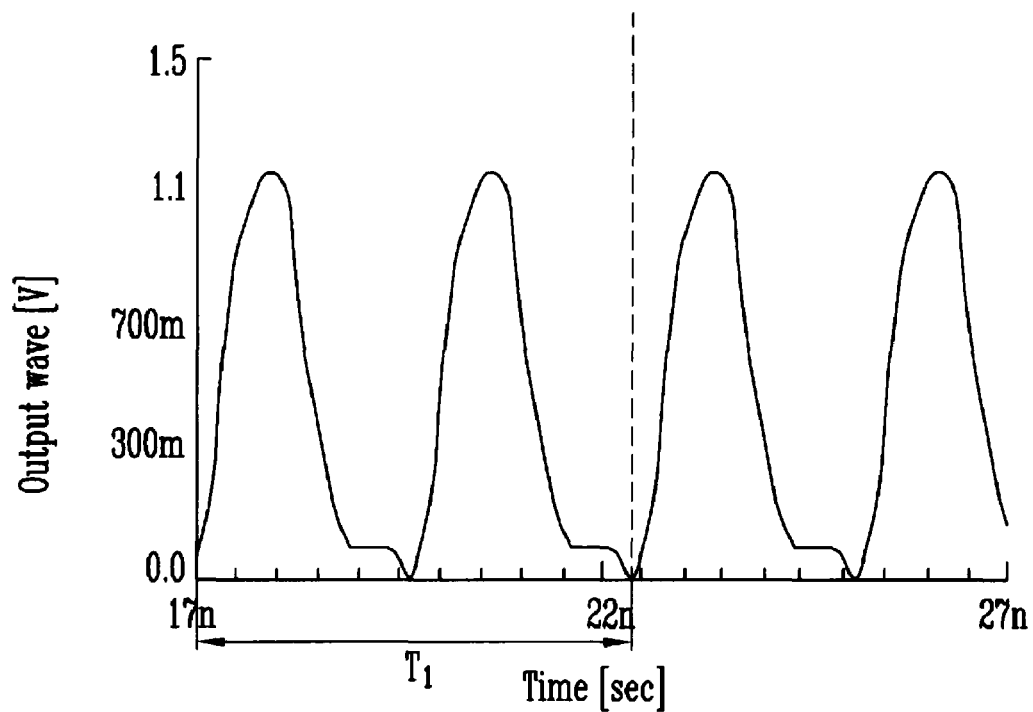
FIGS. 5A and 5B show simulated results with output waveforms in the single and differential modes of the ring oscillator according to an exemplary embodiment of the present invention.
Figure 5B:
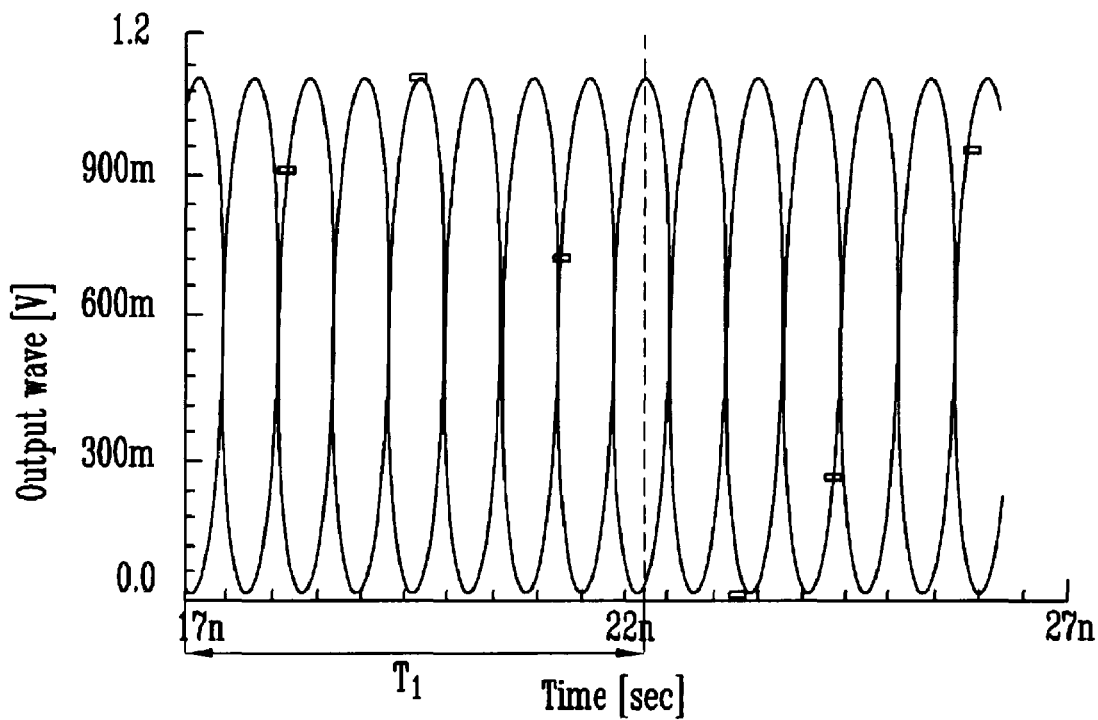

FIGS. 5A and 5B show simulated results with waveforms of the total output signals +Vout and −Vout from the ring oscillator 200 in the single and differential modes.

Referring to FIG. 5A, in the single mode when the third and fourth PMOS transistors PM3 and PM4 are turned off, two waveforms are generated for time T1. Referring to FIG. 5B, in the differential mode when the third and fourth PMOS transistors PM3 and PM4 are turned on, four waveforms are generated for time T1.

In the single mode, the output rate of the differential output signals −Vo and +Vo is determined by an active load value provided from the first and second PMOS transistors PM1 and PM2 of the active load circuit 250 and a capacitance value of the first and second varactors VC1 and VC2 (refer to FIG. 4A). In the differential mode, the output rate of the differential output signals −Vo and +Vo is determined by an active load value provided from the first and second PMOS transistors PM1 and PM2 of the active load circuit 250, a capacitance value of the first and second varactors VC1 and VC2 (refer to FIG. 4B), and the latch strength of the third and fourth PMOS transistors PM3 and PM4 latching the differential output signals −Vo and +Vo. Hence, the differential mode is higher than the single mode in the output rate of the differential output signals −Vo and +Vo.

During this, the strength of latching the differential output signals −Vo and +Vo is dependent on sizes of the third and fourth PMOS transistors PM3 and PM4.

Accordingly, there is a difference in oscillation frequency range between the single and differential modes by a gap of the output rates of the differential output signals −Vo and +Vo therebetween. This difference is shown in FIG. 6.

Figure 6:
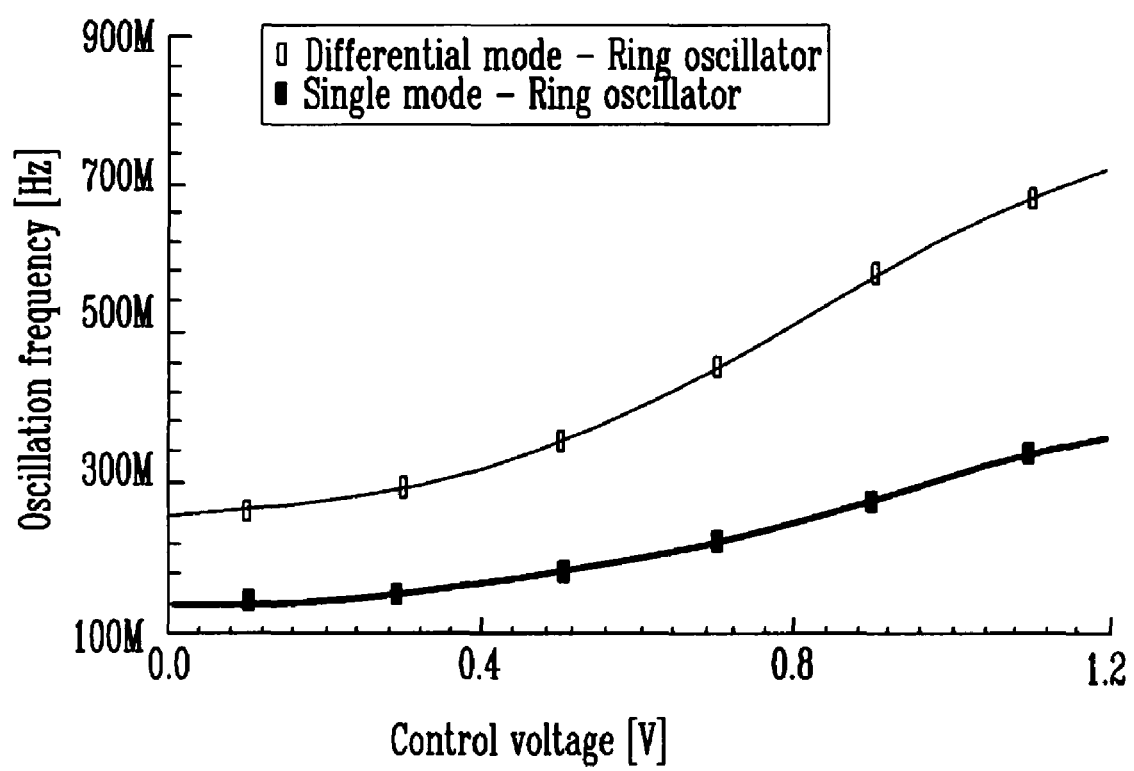
FIG. 6 shows simulated results with oscillation frequencies in the single and differential modes of the ring oscillator according to an exemplary embodiment of the present invention.

FIG. 6 shows simulated results with oscillation frequencies of the single and differential modes from the ring oscillator 200 according to an exemplary embodiment of the present invention.

As shown in FIG. 6, a variable range of the oscillation frequency is 140 to 200 MHz in the single mode and 250 to 700 MHz in the differential mode. From the simulated results, it can be seen that the differential mode is more favorable for generating a high-band oscillation frequency than the single mode.

Consequently, the ring oscillator 200 according to an exemplary embodiment of the present invention can generate various bands of the oscillation frequencies without an additional capacitor since the simplified on/off operation of the first and second switches SW1 and SW2 makes alternating between the single and differential modes easy.

As mentioned above, the ring oscillator 200 according to an exemplary embodiment of the present invention is capable of simply varying the oscillation frequency by using the first control signal Vct1 applied to the first and second varactors VC1 and VC2, as well as extending a range of the oscillation frequency through the first and second varactors VC1 and VC2 included in each of the delay cells 200a to 200d. Thus, the ring oscillator 200 is permitted to have a wide band of the oscillation frequency even in a structure simpler than the conventional ring oscillator.

Additionally, the ring oscillator 200 of the exemplary embodiment is easily applicable to various oscillation systems, without structural complexity, since the first and second switches SW1 and SW2 included in each of the delay cells 200a to 200d function to extend or narrow a range of the oscillation frequency.

While the exemplary embodiments are described in connection with a ring oscillator having four delay cells, the present invention is not restricted to the aforementioned number of delay cells and interconnection structure.

While the exemplary embodiments show each delay cell having a single one of the output-rate control circuit 270, it is also possible to connect switches with a plurality of output-rate control circuits respectively in parallel of multiple stages so as to adjust an output rate of the differential output signals by the switches.

Moreover, the first and second NMOS transistors NM1 and NM2 can be replaced with PMOS transistors. Also, the first to fourth PMOS transistors PM1 to PM4 can be replaced with NMOS transistors. In other words, the delay cell circuit shown in FIG. 3 can be modified to its complementary formation by using the cooperative characteristics of PMOS and NMOS transistors.

As described above, a ring oscillator according to an exemplary embodiment of the present invention is operable in an extended range of oscillation frequency by means of varactors coupled to delay cells even in a simple structure. A wide frequency range results from simply varying an oscillation frequency by adjusting control signals applied to the varactors.

Since additional switches connected to the delay cells contribute to increase or decrease of the oscillation frequency range, the ring oscillator according to an exemplary embodiment of the present invention can conveniently be employed in various types of oscillation systems.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A ring oscillator comprising:
a plurality of delay cells coupled in a loop to generate an oscillation frequency,
wherein each delay cell comprises:
a transconductance circuit configured to receive first differential input signals from the preceding delay cell, invert the first differential input signals, and output differential output signals, which are delayed by a predetermined time through the inversion, to first and second output nodes;
an inversion-rate control circuit connected to the transconductance circuit and configured to vary an inversion rate of the first differential input signals in response to a first control signal provided from an exterior;
an active load circuit configured to receive second differential input signals from the delay cell preceding by two stages and provide an active load to the transconductance circuit; and
an output-rate control circuit configured to vary an output rate of the differential output signals, which are generated from the transconductance circuit, in response to a second control signal provided from the exterior,
wherein the output-rate control circuit comprises:
third and fourth PMOS transistors cross-coupled to each other between a power source voltage and the first and second output nodes; and
first and second switches configured to turn the third and fourth PMOS transistors on/off in response to the second control signal.

2. The ring oscillator of claim 1, wherein the transconductance circuit comprises first and second NMOS transistors with gates to which the first differential input signals are applied, and
wherein the first NMOS transistor is connected between the first output node and a ground while the second NMOS transistor is connected between the second output node and the ground.

3. The ring oscillator of claim 2, wherein the inversion-rate control circuit comprises first and second varactors, and
wherein the first varactor is connected between a drain of the first NMOS transistor and a third node to which the first control signal is applied, and the second varactor is connected between a drain of the second NMOS transistor and the third node.

4. The ring oscillator of claim 3, wherein the inversion rate of the first differential input signals is varied by capacitance values of the first and second varactors in accordance with a level of the first control signal.

5. The ring oscillator of claim 1, wherein the active load circuit comprises first and second PMOS transistors with gates to which the second differential input signals are applied from the delay cell preceding by two stages, and
wherein the first PMOS transistor is connected between the power source voltage and the first output node while the second PMOS transistor is connected between the power source voltage and the second output node.

6. The ring oscillator of claim 1, wherein when the third and fourth PMOS transistors are turned off by the first and second switches in response to the second control signal, the output rate of the differential output signals is determined by the active load value provided from the active load circuit and the inversion rate of the first differential input signals is varied through the inversion-rate control circuit.

7. The ring oscillator of claim 1, wherein when the third and fourth PMOS transistors are turned on by the first and second switches in response to the second control signal, the third and fourth PMOS transistors latch the differential output signals to increase the output rate of the differential output signals.

8. The ring oscillator of claim 7, wherein strength of latching the differential output signals is dependent on sizes of the third and fourth PMOS transistors.

9. The ring oscillator of claim 1, wherein the delay cells are connected to satisfy the Barkhausen oscillation condition.

* * * * *